United States Patent
Han et al.

(10) Patent No.: US 11,381,315 B2
(45) Date of Patent: Jul. 5, 2022

(54) OPTICAL TRANSMITTER MODULE

(71) Applicant: Electronics and Telecommunications Research Institute, Daejeon (KR)

(72) Inventors: Young-Tak Han, Daejeon (KR); Seok Jun Yun, Daejeon (KR); Seoktae Kim, Daejeon (KR); Sang Ho Park, Daejeon (KR); Yongsoon Baek, Daejeon (KR); Jang Uk Shin, Daejeon (KR); Seo Young Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/156,073

(22) Filed: Jan. 22, 2021

(65) Prior Publication Data

US 2021/0234615 A1    Jul. 29, 2021

(30) Foreign Application Priority Data

Jan. 23, 2020 (KR) .................. 10-2020-0009151

(51) Int. Cl.
*H04B 10/50* (2013.01)
*H01S 3/00* (2006.01)
(Continued)

(52) U.S. Cl.
CPC ....... *H04B 10/501* (2013.01); *G02B 6/12019* (2013.01); *H01S 3/0078* (2013.01);
(Continued)

(58) Field of Classification Search
CPC ....... H04B 10/501; H01S 3/0078; H01S 3/23; H04J 14/02; H04Q 11/0005; H04Q 2011/0032; G02B 6/12019
(Continued)

(56) References Cited

U.S. PATENT DOCUMENTS 7,428,358 B2 * 9/2008 Lu ................... G02B 6/305
                                                    385/39
8,545,111 B2 * 10/2013 Ohyama ............ G02B 6/12019
                                                    385/92
(Continued)

FOREIGN PATENT DOCUMENTS

EP          1 672 311        6/2006
KR    10-2006-0070291        6/2006
(Continued)

OTHER PUBLICATIONS

Short reach Optical Communication Using Directly Modulated Lasers MPhil Yuan 2016 (Year: 2016).*
(Continued)

*Primary Examiner* — Abbas H Alagheband
(74) *Attorney, Agent, or Firm* — Kile Park Reed & Houtteman PLLC

(57) ABSTRACT

Disclosed is an optical transmitter module including a directly modulated laser transmitter based on a directly modulated laser (DML) and an arrayed waveguide grating (AWG) chip that is vertically polished. The directly modulated laser transmitter includes a directly modulated laser chip array including one or more directly modulated laser chips, an impedance matching circuit that allows each of the one or more directly modulated laser chips to operate at a critical speed of 100 Gbps per channel or higher, and a radio frequency-flexible printed circuit board (RF-FPCB) that transmits a radio frequency (RF) modulating signal to the directly modulated laser chip array. The arrayed waveguide grating chip includes an optical waveguides that transfer multi-channel optical signals and a wavelength multiplexer that multiplexes the multi-channel optical signals. The directly modulated laser transmitter and the arrayed wave-
(Continued)

guide grating chip are spaced apart from each other and are optically coupled in chip-to-chip.

9 Claims, 7 Drawing Sheets

(51) Int. Cl.
*H01S 3/23* (2006.01)
*H04J 14/02* (2006.01)
*H04Q 11/00* (2006.01)
*G02B 6/12* (2006.01)

(52) U.S. Cl.
CPC ............... *H01S 3/23* (2013.01); *H04J 14/02* (2013.01); *H04Q 11/0005* (2013.01); *H04Q 2011/0032* (2013.01)

(58) Field of Classification Search
USPC .......................................................... 398/87
See application file for complete search history.

(56) References Cited

U.S. PATENT DOCUMENTS

| | | | |
|---|---|---|---|
| 9,411,097 B2* | 8/2016 | Han | G02B 6/4279 |
| 10,608,408 B1* | 3/2020 | Lin | G02B 6/4246 |
| 2003/0095737 A1 | 5/2003 | Welch et al. | |
| 2006/0093369 A1* | 5/2006 | Nagarajan | H04J 14/02 |
| | | | 398/135 |
| 2006/0133712 A1* | 6/2006 | Jang | H04B 10/677 |
| | | | 385/1 |
| 2008/0044128 A1* | 2/2008 | Kish | G02B 6/12033 |
| | | | 385/14 |
| 2008/0095536 A1* | 4/2008 | Shen | G02B 6/12019 |
| | | | 398/79 |
| 2008/0134689 A1* | 6/2008 | Shen | G02B 6/12026 |
| | | | 62/3.7 |
| 2009/0279181 A1* | 11/2009 | Hsieh | H04L 27/223 |
| | | | 359/578 |
| 2010/0322569 A1* | 12/2010 | Ohyama | G02B 6/4267 |
| | | | 385/92 |
| 2013/0148975 A1 | 6/2013 | Kwon et al. | |
| 2014/0029949 A1* | 1/2014 | Assefa | G02B 6/12019 |
| | | | 398/79 |
| 2017/0179680 A1* | 6/2017 | Mahgerefteh | G02B 6/1228 |
| 2018/0062756 A1* | 3/2018 | Ho | H04B 10/572 |
| 2019/0158190 A1 | 5/2019 | Huh et al. | |
| 2019/0165867 A1 | 5/2019 | Chang et al. | |
| 2021/0313765 A1* | 10/2021 | Ogawa | H01S 5/02345 |

FOREIGN PATENT DOCUMENTS

| | | |
|---|---|---|
| KR | 10-1906592 | 10/2018 |
| KR | 10-2019-0060183 | 6/2019 |
| KR | 10-2019-0098665 | 8/2019 |

OTHER PUBLICATIONS

Takaharu Ohyama et al., "Compact Hybrid-Integrated 100-Gbit/s TOSA using EADFB Laser Array and AWG Multiplexer", IEEE Photonics Technology Letters, Apr. 2016, pp. 802-805, vol. 28, No. 7.

Jochen Kreissl et al., "Up to 40-GB/s Directly Modulated Laser Operating at Low Driving Current: Buried-Heterostructure Passive Feedback Laser (BH-PFL)", IEEE Photonics Technology Letters, Mar. 1, 2012, pp. 362-364, vol. 24, No. 5.

Jun Liu et al., "Low-cost hybrid integrated 4×25.78 GB/s CWDM TOSA for 10 km transmission using DFB-LDs and an arrayed waveguide grating multiplexer", Photonics Research, Nov. 2018, pp. 1067-1073, vol. 6, No. 11.

Tomoaki Ota et al., "Enhanced modulation bandwidth of surface-emitting laser with external optical feedback", IEICE Electronics Express, 2004, pp. 368-372, vol. 1, No. 13.

Seokjun Yoon et al., "Effects of External Optical Feedback on 28Gbaud DML Butt-Coupled with AWG-PLC", Electronics and Telecommunications Research Institute ICT Materials & Components Research Institute Optical and Wireless Convergence Research Division Optical Communication Components Research Group, Jun. 4, 2019.

* cited by examiner

OPTICAL TRANSMITTER MODULE

CROSS-REFERENCE TO RELATED APPLICATIONS

This application claims priority under 35 U.S.C. § 119 to Korean Patent Application No. 10-2020-0009151 filed on Jan. 23, 2020, in the Korean Intellectual Property Office, the disclosures of which are incorporated by reference herein in their entireties.

BACKGROUND

Embodiments of the present disclosure described herein relate to an optical communication system, and more particularly, relate to an optical transmitter module for extending a-modulation bandwidth.

As broadband mobiles, clouding networks, IPTVs, and smart-phones become popular, a use of video-based large-capacity communication is increasing explosively. Accordingly, data traffic inside and outside hyper-scale data centers has rapidly increased, and the need for an ultra-high-speed optical transmitter module operating at a speed of 400 Gbps or higher has emerged.

The data transmission rate of 400 Gbps may be implemented by 100 Gbps operation of 4 channels. To implement 400 Gbps, a wavelength multiplexing technology capable of simultaneously transmitting 4 channels is required. In addition, an ultra-high-speed light source capable of transmitting 100 Gbps Pulse Amplitude Modulation 4 (PAM4) signals is required. In general, an electro-absorption modulator integrated laser (EML) is mainly used as a light source capable of transmitting the 100 Gbps PAM4 signal per channel, but there is a problem in that the fabrication yield for the EML is lowered when a distributed feedback laser and an electro-absorption modulator of the EML are co-integrated.

Meanwhile, a directly modulated laser (hereinafter referred to as "DML") may have a simple structure, a high manufacturing yield, and may operate with low power consumption. Therefore, the DML may be easily used as the ultra-high-speed light source for the 100 Gbps PAM4 operation. In general, a waveguide at an output end of the DML is implemented in a straight line shape, and to minimize a light reflection effect, a cross section of the waveguide at the output end is subjected to anti-reflection coating. When the DML chip coated with anti-reflection coating on the cross section of the waveguide of the output end is optically coupled in chip-to-chip to a silica arrayed waveguide grating (hereinafter referred to as "AWG") chip that is vertically polished, an lasing wavelength and a side mode suppression ratio (hereinafter referred to as "SMSR") characteristics of the DML chip may be deteriorated by light reflected from a vertical cross section of the silica AWG chip.

To overcome such a problem, a mutual tilt structure is applied between the waveguide of the output end of the DML and the waveguide of the silica AWG chip. However, this also has a problem in that it is not possible to overcome the decrease in optical coupling efficiency and module manufacturing yield in a DML-based optical transmitter module optically coupled to the silica AWG chip.

Currently, due to a limitation of a relaxation oscillation frequency of the DML itself, the modulation bandwidth generally remains below 28 GHz. To overcome the limitation of the modulation bandwidth of DML, by placing a passive section at a front or a rear of the DML chip, a photon-photon resonance (PPR) phenomenon is being induced. However, since a degree of integration of the DML chip increases, it may lead to a decrease in manufacturing yield and an increase in price for the DML chip.

SUMMARY

Embodiments of the present disclosure provide a DML-based multi-channel optical transmitter module for extending a modulation bandwidth using an external light reflection effect.

According to an embodiment of the present disclosure, an optical transmitter module includes a directly modulated laser transmitter based on a directly modulated laser (DML) and an arrayed waveguide grating (AWG) chip that is vertically polished. The directly modulated laser transmitter includes a directly modulated laser chip array including one or more directly modulated laser (DML) chips, an impedance matching circuit that allows each of the one or more directly modulated laser (DML) chips to operate at a critical speed of 100 Gbps per channel or higher, and a radio frequency-flexible printed circuit board (RF-FPCB) that transmits a radio frequency (RF)-modulating signal to the directly modulated laser chip array. The arrayed waveguide grating (AWG) chip includes optical waveguides that transfer multi-channel optical signals and a wavelength multiplexer that multiplexes the multi-channel optical signals. The directly modulated laser transmitter and the arrayed waveguide grating chip are spaced apart from each other and are optically coupled in chip-to-chip.

According to an embodiment, the arrayed waveguide grating (AWG) chip may be one of a silica arrayed waveguide grating (AWG) chip, a polymer arrayed waveguide grating (AWG) chip, or a silicon arrayed waveguide grating (AWG) chip.

According to an embodiment, the directly modulated laser chip array, the impedance matching circuit, and the radio frequency-flexible printed circuit board may be die-bonded to a silicon carrier on which a ground (GND) metal is deposited.

According to an embodiment, the directly modulated laser chip array and the radio frequency-flexible printed circuit board may be disposed on both sides of the silicon carrier, respectively, the impedance matching circuit may be disposed between the directly modulated laser chip array and the radio frequency-flexible printed circuit board, and the directly modulated laser chip array, the impedance matching circuit, and the radio frequency-flexible printed circuit board may be electrically connected to one another.

According to an embodiment, the electrical connection may be performed by one of wire bonding and flip chip bonding techniques.

According to an embodiment, a spaced distance between the directly modulated laser transmitter and the arrayed waveguide grating chip may be 10 μm or more and 15 μm or less.

According to an embodiment, an air layer may be formed within the spaced distance, and the arrayed waveguide grating chip may have a refractive index contrast of 2%-Δ.

According to an embodiment, the impedance matching circuit may be one of a surface mountable device (SMD) resistor that have 40 ohm or more and 45 ohm or less and a driver IC.

According to an embodiment, the directly modulated laser chip may include a spot-size converter (SSC) that minimizes an optical coupling loss with the arrayed waveguide grating (AWG) chip and a grating that determines an lasing wavelength.

According to an embodiment, the spot-size converter (SSC) and the grating may be arranged in contact with each other in a line, one side of the spot-size converter (SSC) in contact with the grating may be coated with anti-reflection, and one side of the grating in contact with the spot-size converter (SSC) may be coated with total reflection.

According to an embodiment, an optical transmitter module may further include a thermo-electric cooler (TEC) that adjusts a phase of a path of an optical signal.

BRIEF DESCRIPTION OF THE FIGURES

The above and other objects and features of the present disclosure will become apparent by describing in detail some embodiments thereof with reference to the accompanying drawings.

DETAILED DESCRIPTION

Figure 1:
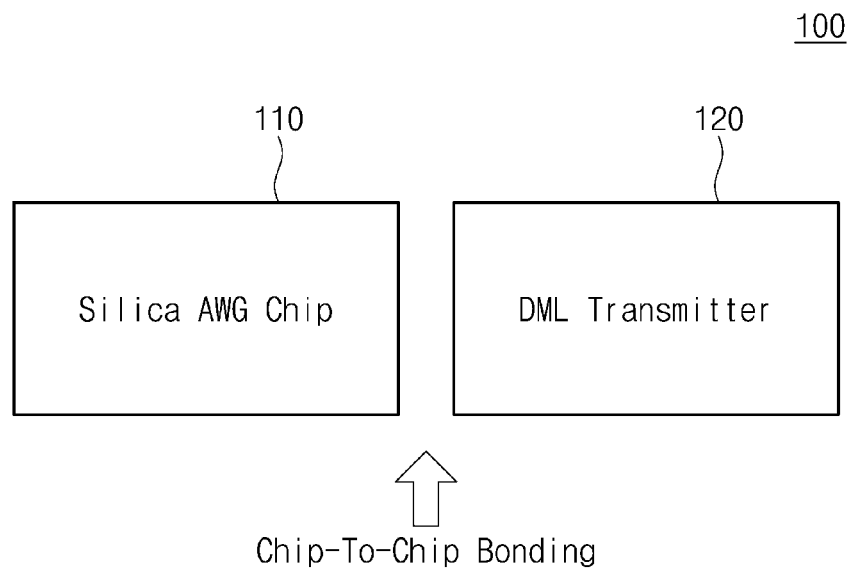
FIG. 1 is a block diagram illustrating an optical transmitter module according to an embodiment of the present disclosure.

Hereinafter, embodiments of the present disclosure will be described clearly and in detail such that those skilled in the art may easily carry out the present disclosure.

The terms used in the present specification are for describing some embodiments, and are not intended to limit the present disclosure. In the present specification, the singular form also includes the plural form unless otherwise specified in the phrase. As used herein, "comprises and/or comprising" does not exclude the presence or addition of one or more other components, steps, operations and/or elements to the mentioned components, steps, operations and/or elements.

Unless otherwise defined, all terms (including technical and scientific terms) used in the present specification may be used as meanings commonly understood by those skilled in the art to which the present disclosure pertains. In addition, terms defined in the commonly used dictionary are not interpreted ideally or excessively unless explicitly defined specifically. In the present specification, the same reference numerals may refer to the same components throughout the entire text.

Hereinafter, in the present specification, an AWG is used as the meaning of an arrayed waveguide grating. A DML is used as the meaning of a directly modulated laser. A SMSR is used as the meaning of a side mode suppression ratio. A RF-FPCB is used as the meaning of radio frequency-flexible printed circuit board. In addition, an effect generated by a reflected light reflected from a vertical section of a silica AWG chip is defined as an external light reflection effect.

In the present specification, an optical transmitter module according to an embodiment of the present disclosure is presented as including a silica AWG chip, but the AWG chip included in the optical transmitter module according to the present disclosure is not limited to a silica-based AWG chip. As an example, the AWG chip may include a polymer or silicon based AWG chip. In addition, in the present specification, the optical transmitter module according to an embodiment of the present disclosure is presented to transmit wavelengths of 4 channels simultaneously, but the number of channels of the wavelengths transmitted by the optical transmitter module according to the present disclosure is not limited thereto.

FIG. 1 is a block diagram illustrating an optical transmitter module according to an embodiment of the present disclosure.

Referring to FIG. 1, an optical transmitter module 100 according to an embodiment of the present disclosure may include a silica AWG chip 110 and a DML transmitter 120. The silica AWG chip 110 and the DML transmitter 120 may be optically coupled to each other in chip-to-chip.

In general, a thin film filter or the AWG may be used as a wavelength multiplexing component for simultaneously transmitting the wavelengths of 4 channels. When implementing a wavelength multiplexer using the thin film filter, alignment should be performed using four individual light source chips and individual lenses. However, such a process has a disadvantage in that it is difficult to implement a low-cost optical transmitter module due to an increase in packaging time and a decrease in packaging yield.

However, in the case of using mutual chip-to-chip optical coupling as in the embodiment of the present disclosure illustrated in FIG. 1, since optical alignment and bonding with respect to four channels may be performed at the same time without using individual lenses, a low-cost optical transmitter module may be implemented. In addition, an effect of the present disclosure may occur due to a spaced distance when the silica AWG chip 110 is optically coupled to the DML transmitter 120 in chip-to-chip, and will be described in detail through FIGS. 6 to 7B to be described later.

Figure 2:
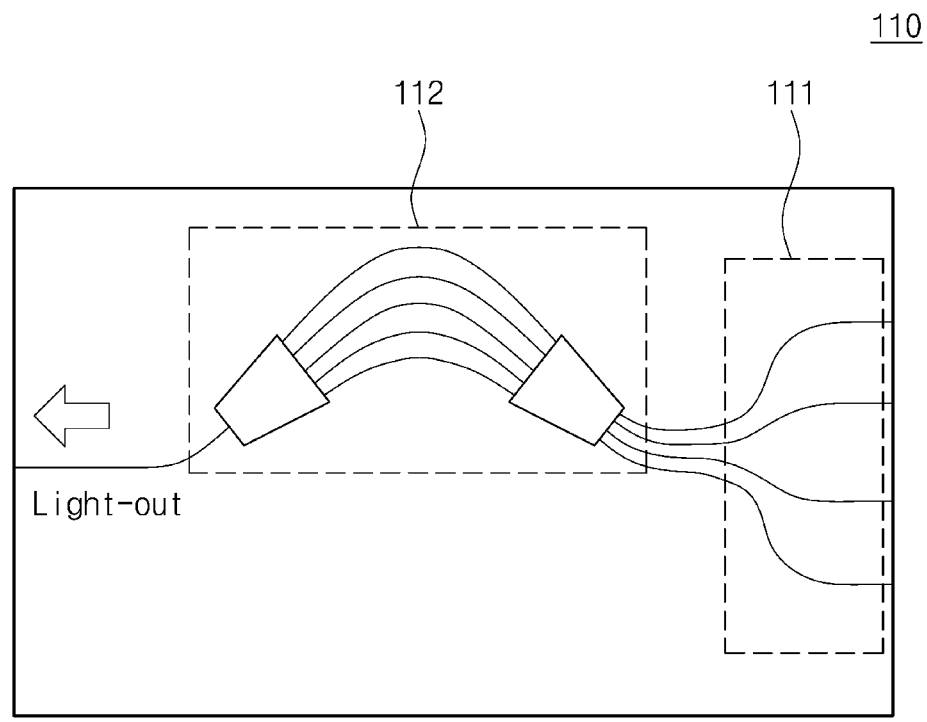
FIG. 2 is a diagram illustrating a structure of a silica AWG chip according to an embodiment of the present disclosure.

FIG. 2 is a diagram illustrating a structure of a silica AWG chip according to an embodiment of the present disclosure.

Referring to FIG. 2, the silica AWG chip 110 may include optical waveguides 111 and a wavelength multiplexer 112. The optical waveguides 111 may receive an optical signal transferred from the DML transmitter 120 (refer to FIG. 1). For example, the optical waveguides 111 may include four channels. The wavelength multiplexer 112 may perform wavelength multiplexing of the optical signal input through the optical waveguides 111. The multiplexed optical signal may be output to a light output unit.

Figure 3:
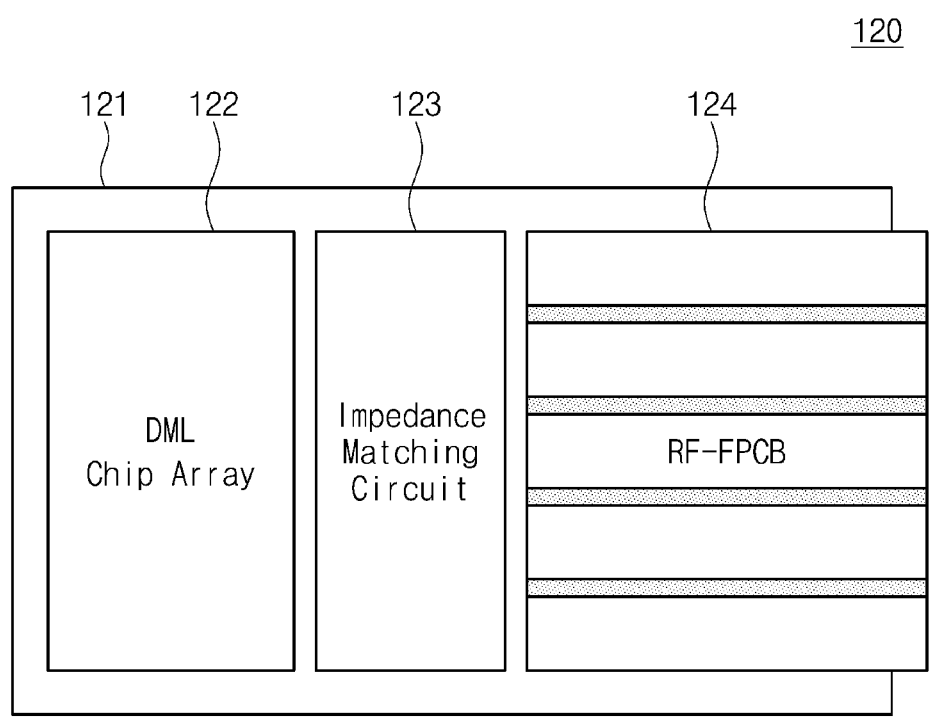
FIG. 3 is a diagram illustrating a structure of a DML transmitter according to an embodiment of the present disclosure.

FIG. 3 is a diagram illustrating a structure of a DML transmitter according to an embodiment of the present disclosure.

Referring to FIG. 3, the DML transmitter 120 according to an embodiment of the present disclosure may include a DML chip array 122, an impedance matching circuit 123, and an RF-FPCB 124. The DML chip array 122 may include one or more DML chips. As an example, the DML, chip array 122 may include four DML, chips.

The DML chip array 122 may operate at a data rate of 28 Gbps or higher by the impedance matching circuit 123. For example, the impedance matching circuit 123 may be replaced with a surface mountable device (SMD) resistor that has 40 ohms to 45 ohms or a driver integrated circuit. The RF-FPCB 124 may transmit a radio frequency modulating signal to the DML chip array 122.

The DML chip array 122, the impedance matching circuit 123, and the RF-FPCB 124 may be die-bonded to a silicon carrier 121 on which a ground metal is deposited. The DML chip array 122 and the RF-FPCB 124 may be disposed on both sides of the DML transmitter 120. The impedance matching circuit 123 may be disposed between the DML chip array 122 and the RF-FPCB 124. The DML chip array 122, the impedance matching circuit 123, and the RF-FPCB 124 may be electrically connected to one another. For example, the electrical connection may include wire-bonding and flip-chip-bonding.

Figure 4:
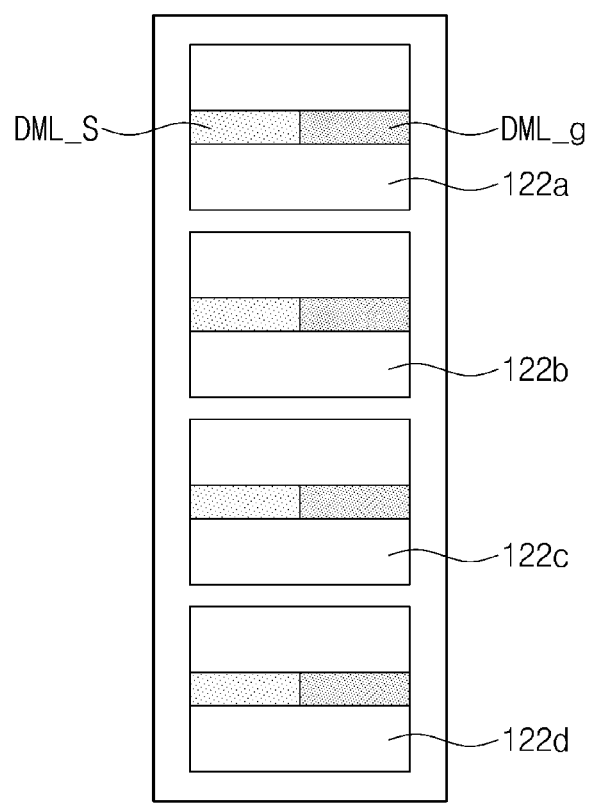
FIG. 4 is a diagram illustrating a structure of a DML chip array according to an embodiment of the present disclosure.

FIG. 4 is a diagram illustrating a structure of a DML chip array according to an embodiment of the present disclosure.

Referring to FIG. 4, the DML chip array 122 may include four DML chips 122a, 122b, 122c, and 122d. Each of the DML chips 122a, 122b, 122c, and 122d may include a spot-size converter (hereinafter referred to as "SSC") DML_S and a grating DML_g. The SSC DML_S may be integrated to minimize optical coupling loss with the silica AWG chip 110 (refer to FIG. 1). The grating DML_g may be integrated to determine an lasing wavelength.

The SSC DML_S and the grating DML_g may be arranged in a line to be in contact. One side of the SSC DML_S in contact with the grating DML_g may be coated with anti-reflection. The anti-reflection coating section may optimize the light reflection effect at the cross section of the waveguide at the output end of the DML transmitter 120 (refer to FIG. 1). One side of the grating DML_g in contact with the SSC DML_S may be coated with total reflection.

Figure 5:
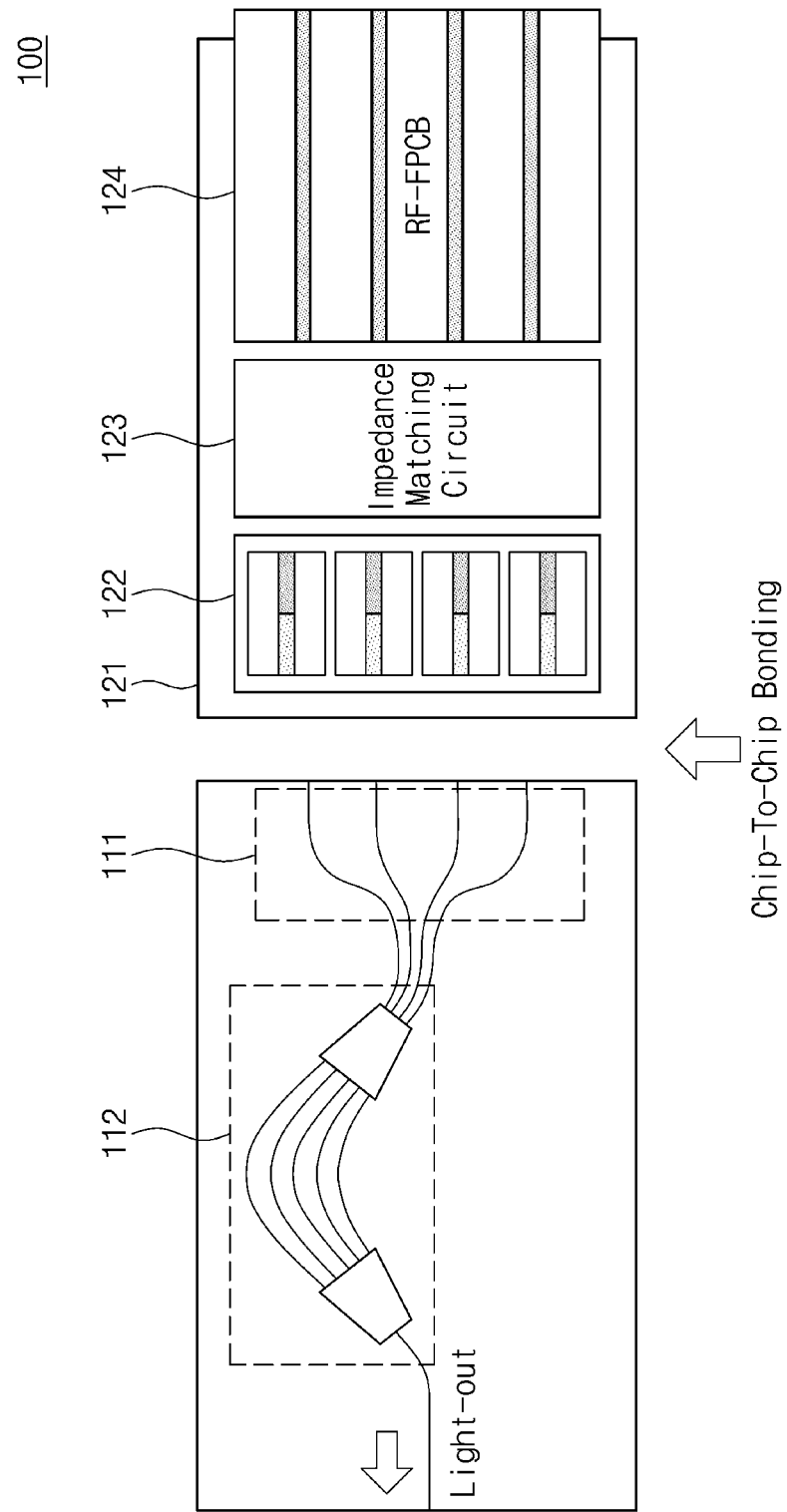
FIG. 5 is a diagram illustrating a structure of an optical transmitter module according to an embodiment of the present disclosure.

FIG. 5 is a diagram illustrating a structure of an optical transmitter module according to an embodiment of the present disclosure.

Referring to FIG. 5, the optical transmitter module 100 (see FIG. 1) according to an embodiment of the present disclosure may include the silica AWG chip 110 (see FIG. 1) including the optical waveguides 111 and the wavelength multiplexer 112, and the DML transmitter 120 including the DML chip array 122, the impedance matching circuit 123, and the RF-FPCB 124, which are die-bonded to the silicon carrier 121 on which the ground metal is deposited.

The silica AWG chip 110 and the DML transmitter 120 may be optically coupled in chip-to-chip. A spaced distance may be included between the silica AWG chip 110 and the DML transmitter 120. The medium forming the spaced distance may be air. The optical transmitter module 100 may transfer the optical signal to be transmitted from the DML transmitter 120 to the silica AWG chip 110. The optical signal transferred from the DML transmitter 120 to the silica AWG chip 110 may generate the external light reflection effect. The modulation bandwidth of the optical transmitter module 100 may be increased by the spaced distance between the silica AWG chip 110 and the DML transmitter 120 through the external light reflection effect. The aspect of increasing the modulation bandwidth will be described in detail in FIGS. 6 to 7B to be described later.

Figure 6:
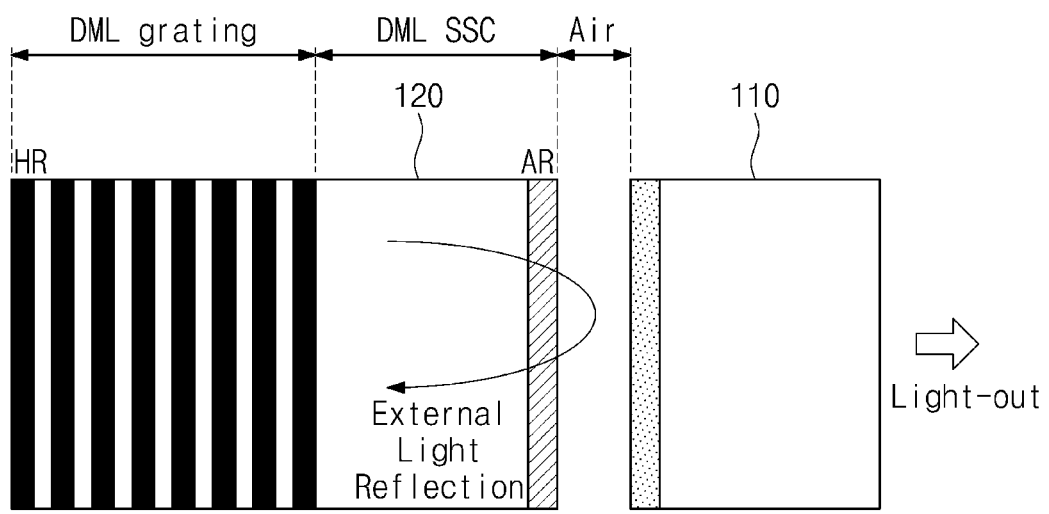
FIG. 6 is a diagram illustrating an effect of an optical transmitter module according to an embodiment of the present disclosure.

FIG. 6 is a diagram illustrating an effect of an optical transmitter module according to an embodiment of the present disclosure.

The optical resonator structure in the optical transmitter module according to an embodiment of the present disclosure includes an SSC DML_SSC integrated in the DML transmitter 120, based on the DML grating formed on the DML transmitter 120, the anti-reflection coating layer AR, an air layer within the spaced distance between the DML transmitter 120 and the silica AWG chip 110, and a path to the cross section of the silica AWG chip 110 that is vertically polished.

When light is incident toward the vertical section of the silica AWG chip 110 having a refractive index contrast of 2%-Δ through the air layer, light corresponding to about 3.5% of the incident light may be reflected. A photon-photon resonance (PPR) phenomenon may occur inside the optical resonator by about 3.5% of reflected light reflected from the vertical cross section of the silica AWG chip 110. The PPR phenomenon occurs differently depending on the spaced distance between the silica AWG chip 110 and the DML transmitter 120, by using this, it is possible to achieve the increase in modulation bandwidth, the SMSR of 35 dB or more, and the high optical output power, which are effects of the present disclosure.

For example, when the spaced distance between the silica AWG chip 110 and the DML transmitter 120 is 5 μm or less, the lasing wavelength of the DML transmitter 120 may become unstable or an SMSR characteristic may be significantly reduced to 30 dB or less. As another example, when the spaced distance between the silica AWG chip 110 and the DML transmitter 120 is 15 μm to 20 μm, the external light reflection effect may be minimized. In this case, the SMSR characteristic of 40 dB to 45 dB may be secured while maintaining the light output power at 2 dBm or more. However, even in this case, since the external light reflection effect is minimized, the effect of increasing the modulation bandwidth hardly occurs.

As another example, when the spaced distance between the silica AWG chip 110 and the DML transmitter 120 is 10 μm to 15 μm it is possible to achieve the SMSR of 35 dB or more, the optical output of 2 dBm or more, and an increase in the modulation bandwidth of about 5 GHz to 10 GHz. In an embodiment, the optimal spaced distance between the silica AWG chip 110 and the DML transmitter 120 included in the optical transmitter module 100 (refer to FIG. 1) may vary based on the light output power and the SMSR characteristics measured when optical alignment is performed in chip-to-chip.

Figure 7A:
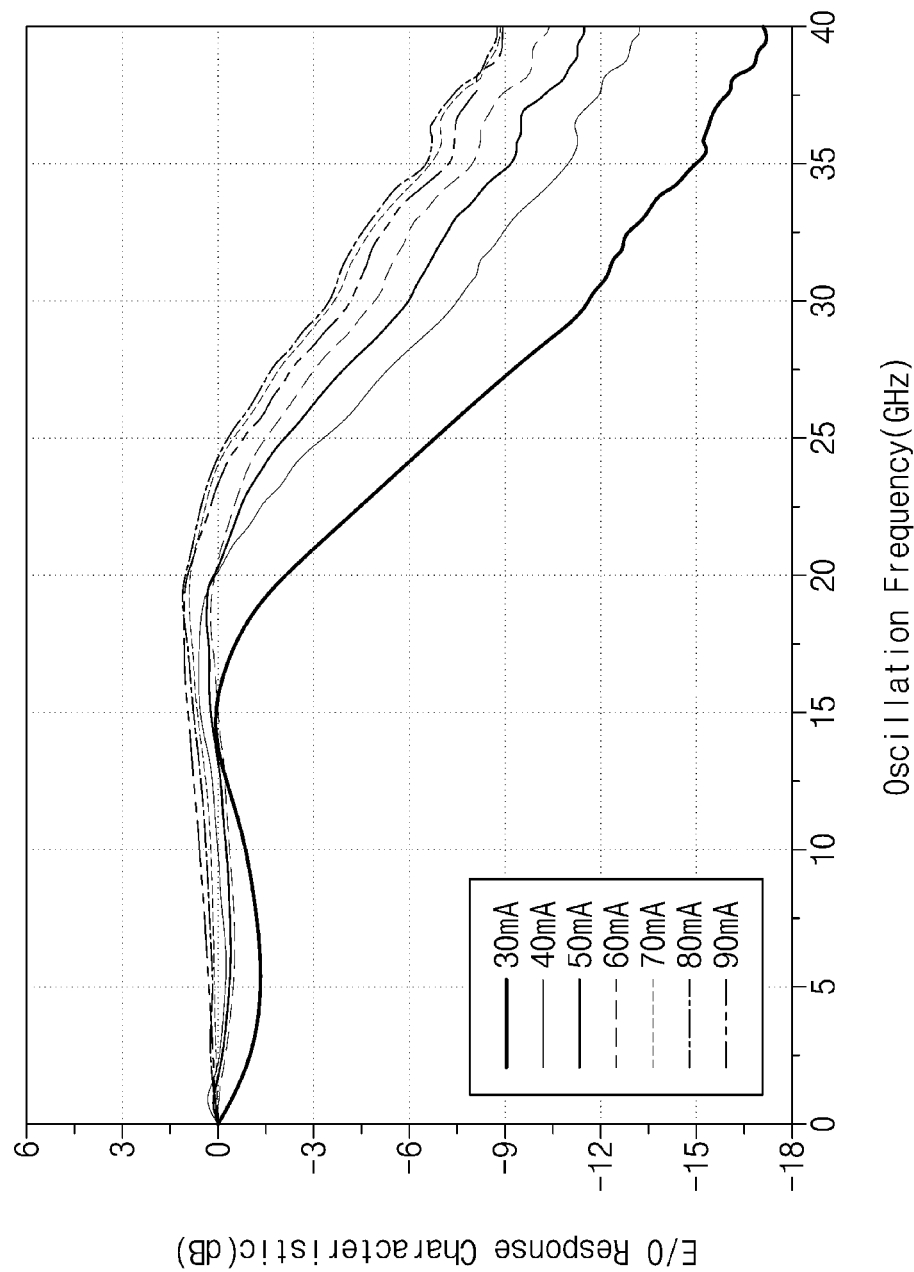
FIG. 7A is a graph illustrating E/O response characteristics measured under a condition in which an external light reflection effect is minimal, according to an embodiment of the present disclosure.

FIG. 7A is a graph illustrating E/O response characteristics measured under a condition in which an external light reflection effect is minimal, according to an embodiment of the present disclosure.

In more detail, FIG. 7A is a graph illustrating E/O response characteristics measured when the spaced distance between the silica AWG chip 110 (refer to FIG. 1) and the DML transmitter 120 (refer to FIG. 1) is 15 μm to 17 μm. When currents of 20 mA to 100 mA are applied to the DML transmitter 120, the SMSR characteristics of 40 dB to 45 dB may be ensured for all currents. In addition, an influence of light reflected from the vertical section of the silica AWG chip 110 is minimized. On the E/O response characteristic graph of FIG. 7A, the 3 dB modulation bandwidth is about 28 GHz, and it may be seen that results which are almost similar to the modulation bandwidth of the commercially available DML chip itself are derived.

Figure 7B:
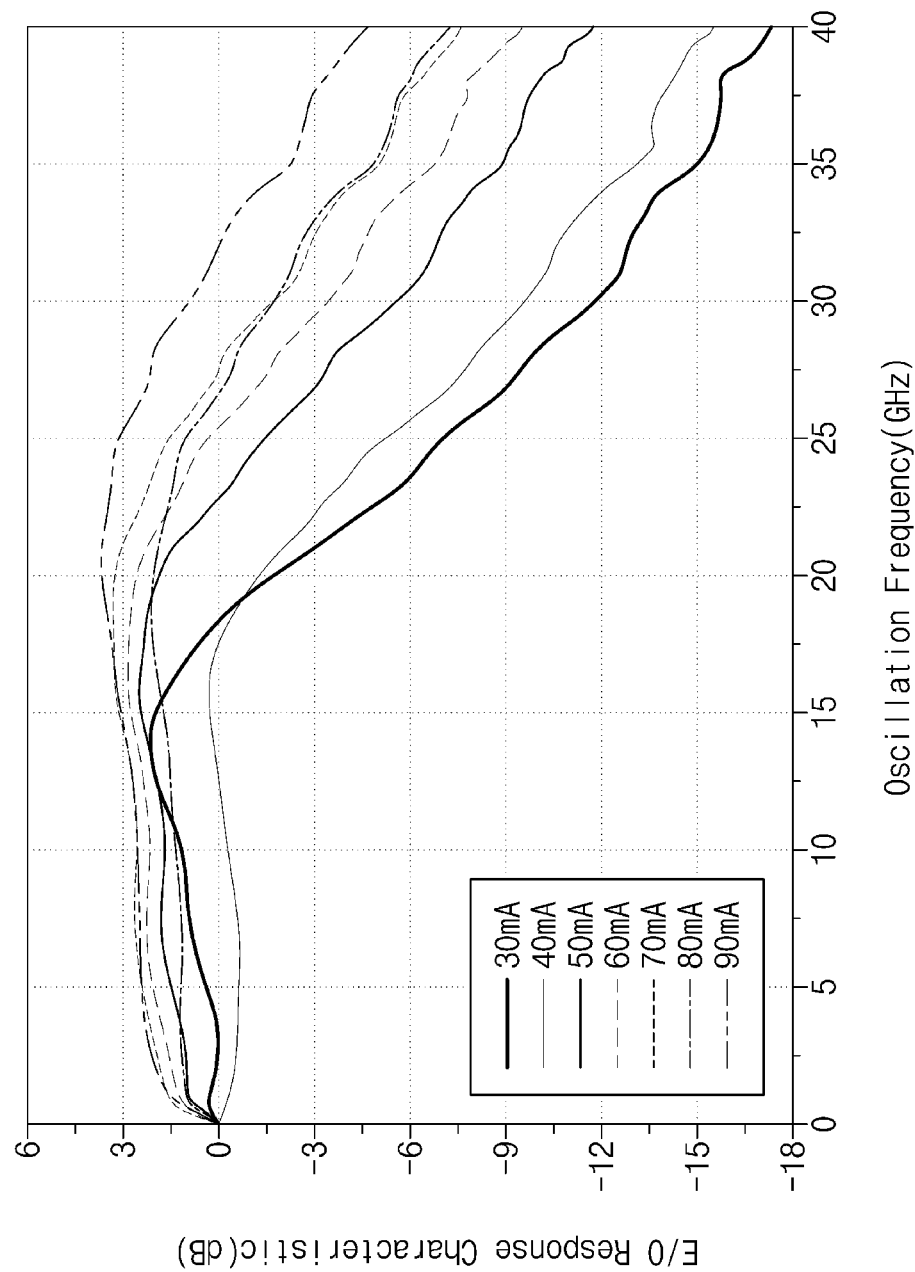
FIG. 7B is a graph illustrating E/O response characteristics measured under a condition in which an external light reflection effect is optimal, according to an embodiment of the present disclosure.

FIG. 7B is a graph illustrating E/O response characteristics measured under a condition in which an external light reflection effect is optimal, according to an embodiment of the present disclosure.

In more detail, FIG. 7B is a graph illustrating E/O response characteristics measured when the spaced distance between the silica AWG chip 110 (refer to FIG. 1) and the DML transmitter 120 (refer to FIG. 1) is 10 μm to 15 μm. When injection currents of 20 mA to 100 mA are applied to the DML transmitter 120, the SMSR characteristic of 38 dB to 43 dB may be secured for all currents. In particular, when a current of 60 mA is applied, an optical output power of 2 dBm or more may be secured. In an embodiment, the optimum spaced distance between the silica AWG chip 110 and the DML transmitter 120 included in the optical transmitter module 100 (refer to FIG. 1) may be varied depending on the light output power and the SMSR characteristics measured when optical alignment is performed in chip-to-chip, but typically, when the spaced distance is less than 10 μm, the SMSR characteristic may be less than 30 dB.

On the E/O response characteristic graph of FIG. 7B, the 3 dB modulation bandwidth is about 32.5 GHz to 37.5 GHz, and it may be seen that an increase in the modulation bandwidth by about 5 GHz to 9.5 GHz occurs when compared with FIG. 7A described above. In other words, as the optical transmitter module 100 according to the present disclosure secures the optimum spaced distance between the silica AWG chip 110 (refer to FIG. 1) and the DML transmitter 120 (refer to FIG. 1), a high light output of 2 dBm or more, a SMSR value of 35 dB or more, and increase of modulation bandwidth may be achieved.

The effect of increasing the modulation bandwidth by the external light reflection described above may be adjusted not only the spaced distance between the silica AWG chip 110 (refer to FIG. 1) and the DML transmitter 120 (refer to FIG. 1), but also may be adjusted by a phase on the optical path between the silica AWG chip 110 (refer to FIG. 1) and the DML transmitter 120 (refer to FIG. 1). The phase on the optical path may be adjusted through temperature control of a thermo-electric cooler (TEC) that is integrated in the optical transmitter module 100.

According to an embodiment of the present disclosure, an optical module may increase the modulation bandwidth of the optical transmitter module by securing the optimum spaced distance between a silica AWG chip and a DML transmitter to generate the optimum external light reflection effect, and may secure an SMSR value of 35 dB or more and a high optical output of more than 2 dBm.

According to an embodiment of the present disclosure, since an optical transmitter module has a simple packaging structure, it may contribute to lowering the cost of the optical module and improving the packaging yield.

The contents described above are specific embodiments for implementing the present disclosure. The present disclosure may include not only the embodiments described above but also embodiments in which a design is simply or easily capable of being changed. In addition, the present disclosure may also include technologies easily changed to be implemented using embodiments. Therefore, the scope of the present disclosure is not limited to the described embodiments but should be defined by the claims and their equivalents.

While the present disclosure has been described with reference to some embodiments thereof, it will be apparent to those of ordinary skill in the art that various changes and modifications may be made thereto without departing from the spirit and scope of the present disclosure as set forth in the following claims.

What is claimed is:

1. An optical transmitter module comprising:
a directly modulated laser transmitter based on a directly modulated laser (DML); and
an arrayed waveguide grating (AWG) chip that is vertically polished, and
wherein the directly modulated laser transmitter includes:
a directly modulated laser chip array including one or more directly modulated laser (DML) chips;
an impedance matching circuit configured to allow each of the one or more directly modulated laser (DML) chips to operate at a critical speed of more than 100 Gbps per channel; and
a radio frequency-flexible printed circuit board (RF-FPCB) configured to transmit a radio frequency (RF)-modulating signal to the directly modulated laser chip array, and
wherein the arrayed waveguide grating (AWG) chip includes:
optical waveguides configured to transfer multi-channel optical signals; and
a wavelength multiplexer configured to multiplex the multi-channel optical signals,
wherein the directly modulated laser transmitter and the arrayed waveguide grating chip are spaced apart from each other and are optically coupled in chip-to-chip,
wherein the impedance matching circuit is disposed between the directly modulated laser chip array and the radio frequency-flexible printed circuit board,
wherein the directly modulated laser transmitter and the arrayed waveguide grating chip is spaced by air,
wherein a spaced distance between the directly modulated laser transmitter and the arrayed waveguide grating chip is 10 μm or more and 15 μm or less,
wherein a spot-size converter (SSC) and the grating are arranged in contact with each other in a line,
wherein one side of the spot-size converter (SSC) in contact with the grating is coated with anti-reflection, and
wherein one side of the grating in contact with the spot-size converter (SSC) is coated with total reflection.

2. The optical transmitter module of claim 1, wherein the arrayed waveguide grating (AWG) chip is one of a silica arrayed waveguide grating (AWG) chip, a polymer arrayed waveguide grating (AWG) chip, or a silicon arrayed waveguide grating (AWG) chip.

3. The optical transmitter module of claim 1, wherein the directly modulated laser chip array, the impedance matching circuit, and the radio frequency-flexible printed circuit board are die-bonded to a silicon carrier on which a ground (GND) metal is deposited.

4. The optical transmitter module of claim 1, wherein the arrayed waveguide grating chip has a refractive index contrast of less than 2%.

5. The optical transmitter module of claim 1, wherein the impedance matching
circuit is one of a surface mountable device (SMD) resistor that have 40 ohm or more and 45 ohm or less and a driver IC.

6. The optical transmitter module of claim 1, wherein the directly modulated laser chip includes:
the spot-size converter (SSC) configured to minimize an optical coupling loss with the arrayed waveguide grating (AWG) chip; and
a grating configured to determine an lasing wavelength.

7. The optical transmitter module of claim 1, further comprising:
a thermo-electric cooler (TEC) configured to adjust a phase of a path of the multi-channel optical signals.

8. An optical transmitter module comprising:
a directly modulated laser transmitter based on a directly modulated laser (DML); and
an arrayed waveguide grating (AWG) chip that is vertically polished, and
wherein the directly modulated laser transmitter includes:
- a directly modulated laser chip array including one or more directly modulated laser (DML) chips;
- an impedance matching circuit configured to allow each of the one or more directly modulated laser (DML) chips to operate at a critical speed of more than 100 Gbps per channel; and
- a radio frequency-flexible printed circuit board (RF-FPCB) configured to transmit a radio frequency (RF)-modulating signal to the directly modulated laser chip array, and wherein the arrayed waveguide grating (AWG) chip includes:
- optical waveguides configured to transfer multi-channel optical signals; and
- a wavelength multiplexer configured to multiplex the multi-channel optical signals, wherein the directly modulated laser transmitter and the arrayed waveguide grating chip are spaced apart from each other and are optically coupled in chip-to-chip, wherein the impedance matching circuit is disposed between the directly modulated laser chip array and the radio frequency-flexible printed circuit board, wherein the directly modulated laser chip array and the radio frequency-flexible printed circuit board are disposed on both sides of the silicon carrier, respectively, and wherein the directly modulated laser chip array, the impedance matching circuit, and the radio frequency-flexible printed circuit board are electrically connected to one another.

9. The optical transmitter module of claim 8, wherein the electrical connection is performed by one of wire bonding and flip chip bonding.

* * * * *